United States Patent
Curcic et al.

(10) Patent No.: US 10,793,425 B2
(45) Date of Patent: Oct. 6, 2020

(54) METHOD FOR PROTECTING A MEMS UNIT AGAINST INFRARED INVESTIGATIONS AND MEMS UNIT

(71) Applicant: Robert Bosch GmbH, Stuttgart (DE)

(72) Inventors: Michael Curcic, Stuttgart (DE); Oliver Willers, Korb (DE); Sven Zinober, Firolzheim (DE); Ulrich Kunz, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 80 days.

(21) Appl. No.: 15/937,352

(22) Filed: Mar. 27, 2018

(65) Prior Publication Data
US 2018/0297837 A1  Oct. 18, 2018

(30) Foreign Application Priority Data
Apr. 13, 2017 (DE) .................. 10 2017 206 386

(51) Int. Cl.
| | | |
|---|---|---|
| A63B 1/00 | (2006.01) | |
| B81B 7/02 | (2006.01) | |
| B81C 1/00 | (2006.01) | |
| G02B 26/08 | (2006.01) | |
| G02B 5/22 | (2006.01) | |
| B81B 7/00 | (2006.01) | |
| G02B 5/02 | (2006.01) | |
| G02B 5/20 | (2006.01) | |

(52) U.S. Cl.
CPC .............. *B81B 7/02* (2013.01); *B81B 7/0012* (2013.01); *B81C 1/00698* (2013.01); *G02B 5/02* (2013.01); *G02B 5/208* (2013.01); *G02B 5/22* (2013.01); *G02B 26/0833* (2013.01); *B81B 2201/0292* (2013.01); *B81B 2201/047* (2013.01)

(58) Field of Classification Search
CPC ................ B81B 7/02; G02B 5/02; G12B 5/22
See application file for complete search history.

(56) References Cited

U.S. PATENT DOCUMENTS

| | | | |
|---|---|---|---|
| 2004/0119591 A1* | 6/2004 | Peeters ............. | G08B 21/0222 340/539.26 |
| 2006/0090556 A1* | 5/2006 | Mancosu ............. | B60C 23/041 73/146 |
| 2015/0200775 A1 | 7/2015 | Guajardo Merchan et al. | |
| 2018/0141805 A1* | 5/2018 | Teo ......................... | B81B 7/02 |
| 2018/0179391 A1* | 6/2018 | Bahlawane ............. | C09D 1/00 |
| 2018/0186701 A1* | 7/2018 | Bahlawane ............. | C04B 35/01 |
| 2018/0251621 A1* | 9/2018 | Prissok ................... | C08J 9/232 |

* cited by examiner

*Primary Examiner* — Jamel E Williams
(74) *Attorney, Agent, or Firm* — Norton Rose Fulbright US LLP; Gerard Messina

(57) ABSTRACT

A method for protecting a MEMS unit, in particular a MEMS sensor, against infrared investigations, at least one area of the MEMS unit being doped, the at least one doped area absorbing, reflecting or diffusely scattering more than 50%, in particular more than 90%, of an infrared light incident upon it.

13 Claims, 1 Drawing Sheet

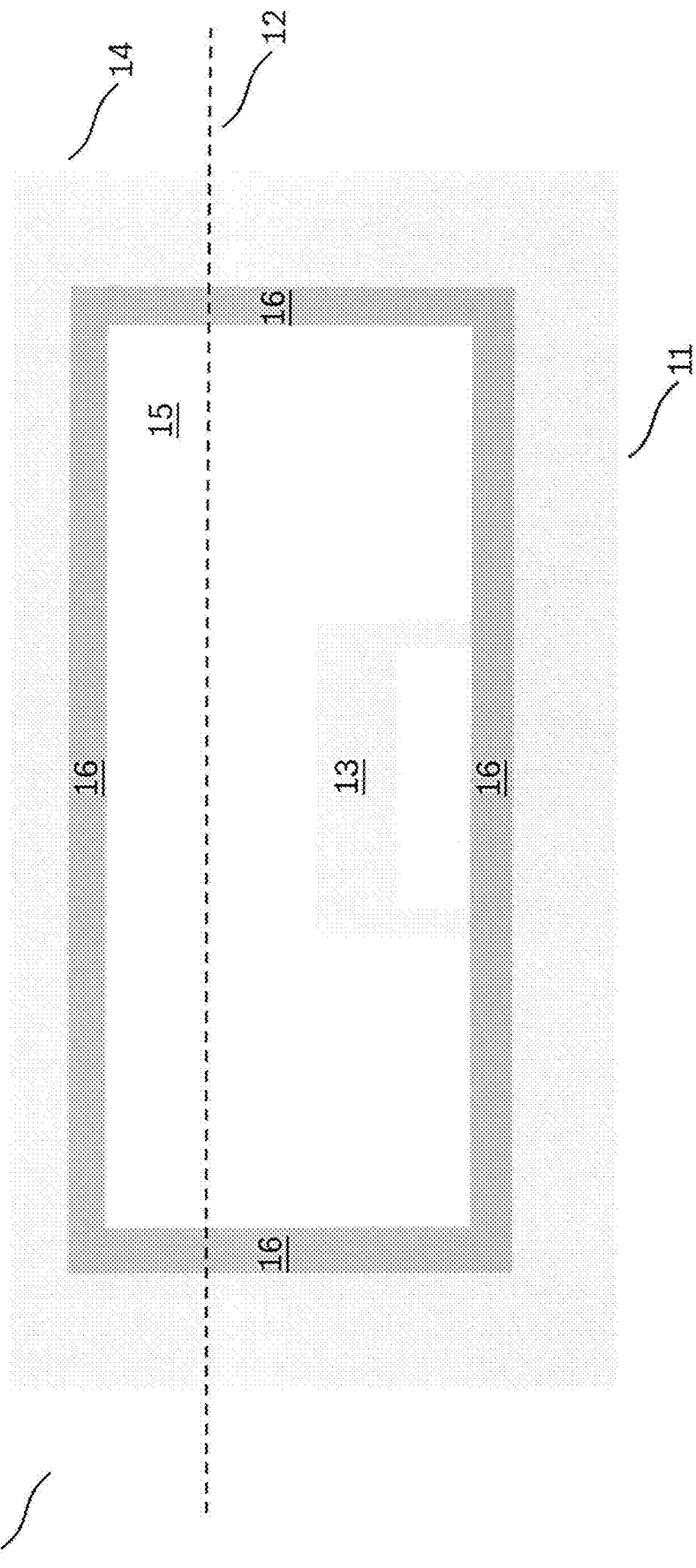

METHOD FOR PROTECTING A MEMS UNIT AGAINST INFRARED INVESTIGATIONS AND MEMS UNIT

CROSS REFERENCE

The present application claims the benefit under 35 U.S.C. § 119 of German Patent Application No. DE 102017206386.6 filed on Apr. 13, 2017, which is expressly incorporated herein by reference in its entirety.

FIELD

The present invention relates to methods for protecting a MEMS unit, in particular a MEMS sensor, against infrared investigations as well as to a MEMS unit and MEMS sensor for this purpose.

BACKGROUND INFORMATION

Microsystems (microelectromechanical systems, MEMS) have made strong gains in importance in recent years. MEMS sensors such as, e.g., MEMS-based inertial sensors are used in countless electronic devices and systems.

The use of secret keys that cannot be read out or copied are the basis for data security in the networked world. These keys are used, e.g., for encrypting data transmissions or also for authenticating network subscribers. After initially pure software keys were used and are still used in non-volatile memories, possibly in especially protected memory areas, the trend is clearly in the direction of hardware-based keys. The currently most prevalent method is the so-called SRAM-PUF (physical unclonable function) in which manufacturing tolerances in transistors result in a random, but repeatable switched state of memory cells after the operating voltage has been applied. SRAM-PUFs, however, have already been read out as well as copied, albeit with considerable effort.

U.S. Patent Application Pub. No. 2015/200775A describes the use of MEMS sensors for hardware-based keys. For this purpose, the most varied and unique manufacturing-based electromechanical properties of these sensors such as, e.g., resonant frequencies (modes), capacitances, internal auxiliary signals are captured by an evaluation circuit and combined to form a key. Invasive methods, i.e., opening the sensors, normally result in the destruction of the key since, e.g., die pressure conditions in the interior of the sensor and the mechanical stresses in the sensor change.

Using currently emerging modern infrared measuring methods such as IR vibrometry or IR interferometry, there is the risk that parts of the key may be read out in a non-invasive manner through the silicon that is transparent for IR light, which reduces the security of the key markedly.

SUMMARY

Methods are provided, by which a MEMS unit, in particular a MEMS sensor, is protected against infrared spectroscopic investigations in that these are prevented or at least rendered more difficult. For this purpose, at least one area of the MEMS unit is doped in such a way that, due to its optical properties, the doped area absorbs, reflects or diffusely scatters at least 50%, in particular at least 90% of an incident infrared light or an infrared light that is irradiated upon it. Non-invasive investigations of internal physical properties by infrared investigation are thereby prevented or rendered more difficult and in particular the security of secrets or keys derived from the properties is ensured or improved.

The main points of approach in this respect are to make the system nontransparent for IR light or to minimize the transmission and/or optical sharpness to such an extent that reading out or analyzing the structure information required for an ascertainment is no longer possible or is no longer readily possible.

The protection is particularly high if the at least one doped area has such structural properties (e.g., extension of the doping profile and doping density) and optical properties (e.g., changed material properties due to the doping) that infrared light striking from any incident angle onto the at least one area is absorbed, reflected or diffusely scattered by the at least one area at 50%, in particular at least at 90%.

In order further to protect the unit or sensor particularly well, in a preferred embodiment, the at least one area is situated in the unit or in the sensor in such a way that light from any direction passes through the at least one area between a surface of the MEMS unit or MEMS sensor and the cavity.

If the MEMS unit or the MEMS sensor is (largely) made of silicon, then boron and phosphor for example are suitable for the doping in order to achieve the desired optical properties. Particularly high densities are achievable by ion implantation. Alternatively, it is also possible to use other doping methods such as deposition methods for example.

MEMS units protected in this way are in particular sensors having a base structure, a sensor cap, an evacuated cavity bounded by the base structure and the sensor cap, and a functional sensor structure applied on the base structure.

In particularly preferred developments, the at least one area is doped prior to completing the MEMS unit or the MEMS sensor, in particular prior to bonding parts of the MEMS unit or the MEMS sensor, the area not being accessible from outside since e.g. an area of the MEMS unit or the MEMS sensor, which borders a cavity of the MEMS unit or MEMS sensor, is doped. As a result, it is impossible to remove the doped area without invasive intervention into the sensor and without great effort.

In alternative preferred developments, the at least one area is doped after the production of the MEMS unit or the MEMS sensor. The at least one area may comprise at least portions of an outer surface of the MEMS unit or the MEMS sensor. To be sure, a protection against removal of the doped area is in this case often reduced. Nevertheless, here too a removal is laborious and possibly results in damage to the unit or to the sensor. Furthermore, in these developments, the doping is easier to achieve.

BRIEF DESCRIPTION OF THE DRAWING

The present invention is explained below in greater detail with reference to the FIGURE and on the basis of exemplary embodiments.

FIG. 1 schematically shows an exemplary MEMS sensor.

DETAILED DESCRIPTION OF EXAMPLE EMBODIMENTS

In measurements using laser IR vibrometry on MEMS sensors, transmission values for infrared frequencies were ascertained in the range of typically approx. 50%. With such measurements, it is possible to determine frequencies in the sensor structure and thus to make inferences regarding the physical properties of the MEMS sensor on which a PUF is based and thus inferences regarding the PUF. The present invention relates to securing MEMS sensors against an investigation using infrared spectroscopy. Aside from MEMS sensors it is also possible to use MEMS units, whose proper functional MEMS structure is optimized in such a way for PUF functionality that the MEMS unit is no longer able to perform any (significant) sensor functions, but serves primarily as a PUF base. Such MEMS units are also to be protected against infrared investigations.

FIG. 1 shows a MEMS sensor 1. MEMS sensor 1 has a base wafer 11, whose delimitation vis-a-vis the other layers 14 is shown by separating line 12. MEMS sensor 1 has additional layers 14, which together with base wafer 11 enclose a cavity 15. Layers 14 may be connected to layers 11 by a bonding method.

Layers 14 are also referred to as a so-called sensor cap. A vacuum is preferably produced in cavity 15. The actual functional sensor structure 13 of MEMS sensor 1 is situated in cavity 15 and on base wafer 11.

Layers 11 and layers 14 as well as sensor structure 13 are usually made of silicon. The MEMS sensor in FIG. 1, however, now has an area 16 that is doped, e.g. with phosphor or boron. In FIG. 1, the area extends to an inner surface of layers 11 and 14, that is, the surface facing cavity 15. This doped area prevents or renders more difficult an investigation of the MEMS sensor using infrared-spectroscopic methods since it is (largely) non-transparent for infrared frequencies and therefore sufficient transmission values for a spectroscopic investigation are not achieved. The extension or layer thickness of the doped area and the doping density or the doping profile should be selected in such a way that at least 50% of an IR light irradiated upon the area is absorbed, reflected or diffusely scattered, in particular at least 90%. Due to the location in the interior of the MEMS sensor 1, a removal of the doped area 16 by an attacker of the PUF is hardly possible since this would massively damage sensor 1 as well as destroy the vacuum of cavity 15. Such an intervention into the sensor structure may also have the consequence that impressed mechanical states of stress (e.g., from the molding process) or pressure ratios change and that as a result the physical properties or the precise expression of the sensor properties, on which the PUF is based, change slightly. The security against manipulation is thus greatly increased. For these reasons, in an alternative development having a doped area lying in the interior of layers 11 or 14, it is likewise preferred that this doped area is situated near the surface facing the cavity.

In alternative developments, the at least one area having the appropriate optical properties may also be provided in different locations of the MEMS sensor. Thus, a doping of an area may also be suitable that includes portions of the outer surface of the MEMS sensor, e.g., by ion implantation. Here, a protection against a removal of the doped area is no longer quite as high as in the previously described exemplary embodiment. However, grinding down the area continues to be laborious and may damage MEMS sensor 1 so that an attack on the PUF of the MEMS sensor is at least rendered much more difficult.

Alternatively, it may already suffice to provide the at least one area only in or on the base wafer or only in or on the sensor cap.

Apart from ion implantation, deposition methods or other conventional doping methods may also be suitable to achieve the desired optical properties. The level of the absorption depends on the size of the doped area and on the doping profile, in particular the density and distribution.

What is claimed is:

1. A method for protecting a MEMS unit against infrared investigations, comprising:
    doping at least one area of the MEMS unit, the at least one doped area one of absorbing, reflecting or diffusely scattering more than 50% of an infrared light incident upon it;
    wherein the at least one area is doped prior to a bonding of parts of the MEMS unit;
    wherein the MEMS unit includes a base structure, a sensor structure, a cavity, and a sensor cap.

2. A method for protecting a MEMS unit against infrared investigations, comprising:
    doping at least one area of the MEMS unit, the at least one doped area one of absorbing, reflecting or diffusely scattering more than 50% of an infrared light incident upon it;
    wherein the at least one area is doped prior to a bonding of parts of the MEMS unit; and
    wherein the at least one area includes an area of the MEMS unit bordering a cavity in an interior of the MEMS unit.

3. A method for protecting a MEMS unit against infrared investigations, comprising:
    doping at least one area of the MEMS unit, the at least one doped area one of absorbing, reflecting or diffusely scattering more than 50% of an infrared light incident upon it;
    wherein the at least one area is doped after production of the MEMS unit, the at least one area including at least portions of an outer surface of the MEMS unit;
    wherein the MEMS unit includes a base structure, a sensor structure, a cavity, and a sensor cap.

4. A method for protecting a MEMS unit against infrared investigations, comprising:
    doping at least one area of the MEMS unit, the at least one doped area one of absorbing, reflecting or diffusely scattering more than 50% of an infrared light incident upon it;
    wherein the at least one area is doped one of: (i) by way of ion implantation, or (ii) by way of deposition methods;
    wherein the at least one area includes an area of the MEMS unit bordering a cavity in an interior of the MEMS unit.

5. The method as recited in claim 4, wherein the MEMS unit is a MEMS sensor.

6. The method as recited in claim 4, wherein the at least one doped area absorb, reflects or diffusely scatters more than 90% of the infrared light incident upon it.

7. The method as recited in claim 4, wherein infrared light striking the at least one area from any angle of incidence is one of absorbed, reflected or diffusely scattered by the at least one area at at least 50%.

8. The method as recited in claim 4, wherein the at least one area comprises silicon layers that are doped using one of boron or phosphor.

9. A MEMS unit having at least one doped area, which one of absorbs, reflects or diffusely scatters more than 50% of an irradiated infrared light, the MEMS unit further comprising a base structure, a sensor structure, a cavity, and a sensor cap.

10. The MEMS unit as recited in claim 9, wherein the MEMS unit is a MEMS sensor.

11. The MEMS unit as recited in claim 9, wherein the at least one area absorbs, reflect, or diffusely scatters more than 90% of the irradiated infrared light.

12. The MEMS unit as recited in claim 9, wherein the at least one area is situated in such a way that light from any direction passes through the at least one area between a surface of the MEMS unit and the cavity.

13. The MEMS unit as recited in claim 12, wherein the at least one area is situated in the sensor cap.

* * * * *